(12) United States Patent
Ramkumar et al.

(10) Patent No.: US 8,445,381 B2
(45) Date of Patent: *May 21, 2013

(54) OXIDE-NITRIDE STACK GATE DIELECTRIC

(75) Inventors: Krishnaswamy Ramkumar, San Jose, CA (US); Sundar Narayanan, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 204 days.

This patent is subject to a terminal disclaimer.

(21) Appl. No.: 11/961,750

(22) Filed: Dec. 20, 2007

(65) Prior Publication Data

US 2008/0093680 A1 Apr. 24, 2008

Related U.S. Application Data

(63) Continuation of application No. 10/950,332, filed on Sep. 24, 2004, now Pat. No. 7,371,637.

(60) Provisional application No. 60/506,713, filed on Sep. 26, 2003.

(51) Int. Cl.
*H01L 21/02* (2006.01)

(52) U.S. Cl.
USPC ........... 438/680; 438/696; 438/701; 438/714; 438/791; 257/E21.255; 257/E21.293; 257/E21.507

(58) Field of Classification Search
USPC ................. 438/303–305, 396, 405–410, 696, 438/731; 257/E21.211, 222, 435, 585–596
See application file for complete search history.

(56) References Cited

U.S. PATENT DOCUMENTS

| | | | |
|---|---|---|---|
| 5,045,488 A | 9/1991 | Yeh | |
| 5,385,866 A | 1/1995 | Bartush | |
| 5,387,540 A * | 2/1995 | Poon et al. | 438/430 |
| 5,393,685 A | 2/1995 | Yoo et al. | |
| 5,633,523 A | 5/1997 | Kato | |
| 5,670,431 A * | 9/1997 | Huanga et al. | 438/396 |
| 5,721,090 A | 2/1998 | Okamoto et al. | |
| 5,756,392 A | 5/1998 | Lu et al. | |
| 5,798,296 A | 8/1998 | Fazan et al. | |
| 5,817,579 A | 10/1998 | Ko et al. | |
| 5,837,585 A | 11/1998 | Wu et al. | |
| 5,877,074 A | 3/1999 | Jeng et al. | |
| 5,937,289 A | 8/1999 | Bronner et al. | |
| 5,939,763 A * | 8/1999 | Hao et al. | 257/411 |
| 6,002,615 A | 12/1999 | Sawada | |

(Continued)

FOREIGN PATENT DOCUMENTS

| | | |
|---|---|---|
| EP | 0327210 A1 | 8/1989 |
| WO | 0003425 A1 | 1/2000 |

OTHER PUBLICATIONS

International Search Report and Written Opinion for International Application No. PCT/US2004/031541 dated Feb. 7, 2005.

(Continued)

*Primary Examiner* — Michael Lebentritt

(57) ABSTRACT

A method of making a semiconductor structure comprises forming an oxide layer on a substrate; forming a silicon nitride layer on the oxide layer; annealing the layers in NO; and annealing the layers in ammonia. The equivalent oxide thickness of the oxide layer and the silicon nitride layer together is at most 25 Angstroms.

8 Claims, 6 Drawing Sheets

U.S. PATENT DOCUMENTS

| | | | |
|---|---|---|---|
| 6,087,063 A | 7/2000 | Hada et al. | |
| 6,107,135 A | 8/2000 | Kleinhenzs et al. | |
| 6,115,321 A | 9/2000 | Koelling et al. | |
| 6,117,795 A | 9/2000 | Pasch | |
| 6,121,124 A | 9/2000 | Liu | |
| 6,127,227 A | 10/2000 | Lin et al. | |
| 6,133,093 A | 10/2000 | Prinz et al. | |
| 6,137,780 A | 10/2000 | Darcie et al. | |
| 6,165,884 A | 12/2000 | Lee et al. | |
| 6,177,334 B1 | 1/2001 | Chen et al. | |
| 6,180,453 B1 | 1/2001 | Sung et al. | |
| 6,188,136 B1 | 2/2001 | Asamura | |
| 6,194,128 B1 | 2/2001 | Tao et al. | |
| 6,207,506 B1 | 3/2001 | Yi et al. | |
| 6,207,542 B1 * | 3/2001 | Ibok | 438/585 |
| 6,232,163 B1 | 5/2001 | Voldman et al. | |
| 6,245,652 B1 | 6/2001 | Gardner et al. | |
| 6,248,628 B1 | 6/2001 | Halliyal et al. | |
| 6,258,677 B1 | 7/2001 | Ang et al. | |
| 6,274,467 B1 | 8/2001 | Gambino et al. | |
| 6,277,200 B2 | 8/2001 | Xia et al. | |
| 6,278,129 B1 | 8/2001 | Sugasawara et al. | |
| 6,284,633 B1 | 9/2001 | Nagabushnam et al. | |
| 6,287,913 B1 | 9/2001 | Agnello et al. | |
| 6,303,482 B1 | 10/2001 | Wu et al. | |
| 6,303,483 B1 | 10/2001 | Kunikiyo | |
| 6,306,743 B1 | 10/2001 | Lee | |
| 6,342,452 B1 | 1/2002 | Coronel et al. | |
| 6,372,672 B1 | 4/2002 | Kim et al. | |
| 6,380,008 B2 | 4/2002 | Kwok et al. | |
| 6,410,428 B1 | 6/2002 | Chiang et al. | |
| 6,420,250 B1 | 7/2002 | Cho et al. | |
| 6,429,135 B1 | 8/2002 | Chern et al. | |
| 6,429,496 B1 | 8/2002 | Li et al. | |
| 6,448,140 B1 | 9/2002 | Liaw | |
| 6,451,647 B1 | 9/2002 | Yang et al. | |
| 6,465,370 B1 | 10/2002 | Schrems et al. | |
| 6,465,837 B1 | 10/2002 | Wu et al. | |
| 6,479,405 B2 | 11/2002 | Lee et al. | |
| 6,486,020 B1 | 11/2002 | Thakur et al. | |
| 6,506,647 B2 | 1/2003 | Kuroda et al. | |
| 6,528,431 B2 | 3/2003 | Tanabe et al. | |
| 6,541,830 B1 | 4/2003 | Iyer | |
| 6,542,424 B2 | 4/2003 | Endo et al. | |
| 6,552,401 B1 | 4/2003 | Dennison | |
| 6,559,007 B1 | 5/2003 | Weimer | |
| 6,602,746 B2 | 8/2003 | Tanaka | |
| 6,617,636 B2 | 9/2003 | Tuan et al. | |
| 6,624,068 B2 | 9/2003 | Thakar et al. | |
| 6,635,185 B2 | 10/2003 | Demmin et al. | |
| 6,680,516 B1 | 1/2004 | Blosse et al. | |
| 6,686,242 B2 | 2/2004 | Willer et al. | |
| 6,686,243 B2 | 2/2004 | Jang | |
| 6,686,617 B2 | 2/2004 | Agnello et al. | |
| 6,706,613 B2 | 3/2004 | You et al. | |
| 6,713,780 B2 | 3/2004 | Lam | |
| 6,728,142 B2 | 4/2004 | Merritt et al. | |
| 6,740,566 B2 | 5/2004 | Lyons et al. | |
| 6,767,834 B2 | 7/2004 | Chung et al. | |
| 6,797,575 B2 | 9/2004 | Kim et al. | |
| 6,800,543 B2 | 10/2004 | Taguwa | |
| 6,803,321 B1 * | 10/2004 | Blosse et al. | 438/740 |
| 6,812,529 B2 | 11/2004 | Trivedi et al. | |
| 6,828,634 B2 | 12/2004 | Oshima | |
| 6,833,310 B2 | 12/2004 | Kim et al. | |
| 6,897,120 B2 | 5/2005 | Trapp | |
| 6,984,575 B2 | 1/2006 | Yamamoto | |
| 7,041,584 B2 | 5/2006 | Tanaka et al. | |
| 7,060,558 B2 | 6/2006 | Hofmann et al. | |
| 7,192,887 B2 | 3/2007 | Hasegawa | |
| 7,229,929 B2 | 6/2007 | Chowdhury | |
| 7,252,773 B2 | 8/2007 | Hall | |
| 7,351,663 B1 * | 4/2008 | Kabansky et al. | 438/706 |
| 7,371,637 B2 | 5/2008 | Ramkumar et al. | |
| 2002/0058410 A1 | 5/2002 | Sung et al. | |
| 2002/0142500 A1 * | 10/2002 | Foglietti et al. | 438/22 |
| 2003/0020111 A1 | 1/2003 | Bevan | |
| 2003/0143808 A1 | 7/2003 | Jang | |
| 2004/0029354 A1 | 2/2004 | You et al. | |
| 2004/0214448 A1 | 10/2004 | Chan et al. | |
| 2004/0248393 A1 | 12/2004 | Tanaka et al. | |
| 2005/0287823 A1 * | 12/2005 | Ramachandran et al. | 438/791 |

OTHER PUBLICATIONS

Wu, Y., et al., "Aggressively Scaled P-Channel MOSFETS with Stacked Nitride-Oxide-Nitride, N/O/N, Gate Dielectrics", Materials Research Society Symposium Proceedings, vol. 567, pp. 101-106, (Apr. 5, 1999).

Kim, B., et al., "Ultra Thin (<3nm) High Quality Nitride/Oxide Stack Gate Dielectrics Fabricated by In-Situ Rapid Thermal Processing", IEEE, pp. 463-466. (1997).

Lin, W.H., et al., "Impacts of Buffer Oxide Layer in Nitride/Oxide Stack Gate Dielectrics on the Device Performance and Dielectric Reliability", Electrochem. Solid-State Lett., 5, F7, (2002).

Kirk-Othmer, Encyclopedia of Chemical Technology, vol. 14, pp. 677-709, (1995).

Aaron Hand, "Industry Begins to Embrace ALD", Semiconductor International, (May 1, 2003).

USPTO Notice of Allowance for U.S. Appl. No. 11/169,176 dated Nov. 1, 2007; 6 pages.

USPTO Final Rejection for U.S. Appl. No. 11/169,176 dated Jul. 10, 2007; 8 pages.

USPTO Non-Final Rejection for U.S. Appl. No. 11/169,176 dated Feb. 5, 2007; 7 pages.

USPTO Non-Final Rejection for U.S. Appl. No. 11/169,176 dated Oct. 2, 2006; 6 pages.

Peter Van Zant, "Microchip Fabrication: A Practical Guide to Semiconductor Processing," 2000, 3rd Ed., Chapter 16, pp. 491-527; 39 pages.

USPTO Notice of Allowance for U.S. Appl. No. 10/313,049 dated May 7, 2004; 4 pages.

USPTO Final Rejection for U.S. Appl. No. 10/313,049 dated Feb. 24, 2004; 9 pages.

USPTO Non-Final Rejection for U.S. Appl. No. 10/313,049 dated Apr. 4, 2003; 9 pages.

Robert F. Pierret, "Semiconductor Device Fundamentals," Addison-Wesley, 1996, pp. 525-530 and 149-174; 34 pages.

USPTO Notice of Allowance for U.S. Appl. No. 10/801,432 dated Aug. 10, 2006; 4 pages.

USPTO Non-Final Rejection for U.S. Appl. No. 10/801,432 dated Oct. 18, 2005; 6 pages.

USPTO Notice of Allowance for U.S. Appl. No. 10/314,380 dated Jan. 25, 2007; 6 pages.

USPTO Non-Final Rejection for U.S. Appl. No. 10/314,380 dated Jul. 27, 2006; 9 pages.

USPTO Non-Final Rejection for U.S. Appl. No. 10/314,380 dated Feb. 22, 2006; 10 pages.

USPTO Non-Final Rejection for U.S. Appl. No. 10/314,380 dated Sep. 1, 2005; 9 pages.

USPTO Final Rejection for U.S. Appl. No. 10/314,380 dated Apr. 29, 2005; 10 pages.

USPTO Non-Final Rejection for U.S. Appl. No. 10/314,380 dated Sep. 27, 2004; 9 pages.

USPTO Notice of Allowance for U.S. Appl. No. 10/313,267 dated Aug. 26, 2003; 5 pages.

USPTO Non-Final Rejection for U.S. Appl. No. 10/313,267 dated Apr. 30, 2003; 5 pages.

USPTO Notice of Allowance for U.S. Appl. No. 10/801,432 dated Oct. 23, 2006; 5 pages.

Kern et al., "Advances in Deposition Processes for Passivation Films," Journal of Vacuum Science & Technology B, Sep./Oct. 1977, vol. 14, No. 5, pp. 1082-1099; 18 pages.

"Material Safety Data Sheet," EKC Technology, Product Name: EKC265, I.E. du Pont de Nemours and Company, Nov. 2004, pp. 1-10; 10 pages.

Wolf et al., "Silicon Processing for the VLSI Era," vol. 1: Process Technology, 1999, pp. 550-556; 7 pages.

USPTO Advisory Action for U.S. Appl. No. 10/313,283 dated Jan. 6, 2006; 3 pages.

Kim et al., "Sidewall Oxidation Behavior of Dichlorosilane-Based W-Polycide Gate," Journal of Vacuum Science & Technology B, vol. 19, No. 2, (2001), pp. 361-365; 5 pages.

USPTO Notice of Allowance for U.S. Appl. No. 10/186,453 dated Jul. 28, 2009; 4 pages.

USPTO Non-Final Rejection for U.S. Appl. No. 10/186,453 dated Feb. 9, 2009; 10 pages.

USPTO Advisory Action for U.S. Appl. No. 10/186,453 dated Oct. 8, 2008; 3 pages.

USPTO Final Rejection for U.S. Appl. No. 10/186,453 dated May 20, 2008; 15 pages.

USPTO Miscellaneous Action for U.S. Appl. No. 10/186,453 dated Jan. 15, 2008; 2 pages.

USPTO Non-Final Rejection for U.S. Appl. No. 10/186,453 dated Aug. 8, 2007; 11 pages.

USPTO Advisory Action for U.S. Appl. No. 10/186,453 dated Mar. 28, 2007; 3 pages.

USPTO Final Rejection for U.S. Appl. No. 10/186,453 dated Feb. 8, 2007; 11 pages.

USPTO Non-Final Rejection for U.S. Appl. No. 10/186,453 dated Aug. 18, 2006; 7 pages.

USPTO Miscellaneous Action for U.S. Appl. No. 10/186,453 dated May 2, 2006; 2 pages.

USPTO Advisory Action for U.S. Appl. No. 10/186,453 dated Dec. 1, 2005; 3 pages.

USPTO Final Rejection for U.S. Appl. No. 10/186,453 dated Aug. 8, 2005; 8 pages.

USPTO Non-Final Rejection for U.S. Appl. No. 10/186,453 dated Jan. 11, 2005; 7 pages.

USPTO Advisory Action for U.S. Appl. No. 10/186,453 dated Oct. 26, 2004; 3 pages.

USPTO Final Rejection for U.S. Appl. No. 10/186,453 dated Apr. 28, 2004; 8 pages.

USPTO Requirement Restriction for U.S. Appl. No. 10/186,453 dated Jan. 20, 2004; 4 pages.

USPTO Non-Final Rejection for U.S. Appl. No. 10/186,453 dated Jun. 6, 2003; 10 pages.

USPTO Miscellaneous Action for U.S. Appl. No. 10/314,380 dated Jan. 8, 2004; 1 page.

USPTO Ex Parte Quayle Action for U.S. Appl. No. 10/801,432 dated Mar. 22, 2006; 5 pages.

USPTO Requirement for Restriction/Election for U.S. Appl. No. 10/313,048 dated Mar. 3, 2005; 4 pages.

USPTO Miscellaneous Action for U.S. Appl. No. 10/185,646 dated Jul. 16, 2007; 1 page.

USPTO Notice of Allowance for U.S. Appl. No. 10/185,646 dated Apr. 9, 2007; 5 pages.

USPTO Final Rejection for U.S. Appl. No. 10/185,646 dated Jan. 23, 2007; 7 pages.

USPTO Requirement for Restriction/Election for U.S. Appl. No. 10/185,646 dated Dec. 18, 2006; 5 pages.

USPTO Non-Final Rejection for U.S. Appl. No. 10/185,646 dated Jul. 13, 2006; 5 pages.

USPTO Ex Parte Quayle Action for U.S. Appl. No. 10/185,646 dated Feb. 24, 2006; 4 pages.

USPTO Non-Final Rejection for U.S. Appl. No. 10/185,646 dated Aug. 24, 2005; 6 pages.

USPTO Non-Final Rejection for U.S. Appl. No. 10/185,646 dated Mar. 9, 2005; 11 pages.

USPTO Miscellaneous Action for U.S. Appl. No. 10/185,646 dated Dec. 14, 2004; 2 pages.

USPTO Non-Final Rejection for U.S. Appl. No. 10/185,646 dated Aug. 24, 2004; 11 pages.

USPTO Non-Final Rejection for U.S. Appl. No. 10/185,646 dated Mar. 25, 2004; 10 pages.

USPTO Non-Final Rejection for U.S. Appl. No. 10/185,646 dated Sep. 25, 2003; 8 pages.

USPTO Requirement for Restriction/Election for U.S. Appl. No. 10/185,646 dated Jun. 11, 2003; 4 pages.

USPTO Non-Final Rejection for U.S. Appl. No. 10/313,048 dated Jun. 23, 2005; 8 pages.

USPTO Non-Final Rejection for U.S. Appl. No. 10/313,048 dated Oct. 31, 2005; 8 pages.

USPTO Final Rejection for U.S. Appl. No. 10/313,048 dated Apr. 19, 2006; 10 pages.

USPTO Advisory Action for U.S. Appl. No. 10/313,048 dated Jun. 13, 2006; 3 pages.

USPTO Non-Final Rejection for U.S. Appl. No. 10/313,048 dated Aug. 17, 2006; 8 pages.

USPTO Notice of Allowance for U.S. Appl. No. 10/313,048 dated Oct. 31, 2006; 6 pages.

USPTO Requirement for Restriction/Election for U.S. Appl. No. 10/313,049 dated Oct. 22, 2003; 4 pages.

USPTO Non-Final Rejection for U.S. Appl. No. 10/313,283 dated Feb. 15, 2006; 9 pages.

USPTO Non-Final Rejection for U.S. Appl. No. 10/313,283 dated Apr. 12, 2005; 11 pages.

USPTO Final Rejection for U.S. Appl. No. 10/313,283 dated Jul. 27, 2006; 9 pages.

USPTO Advisory Action for U.S. Appl. No. 10/313,283 dated Oct. 27, 2006; 3 pages.

USPTO Final Rejection for U.S. Appl. No. 10/313,283 dated Sep. 21, 2005; 8 pages.

USPTO Notice of Allowance for U.S. Appl. No. 10/313,283 dated Mar. 12, 2008; 7 pages.

USPTO Advisory Action for U.S. Appl. No. 10/313,283 dated Nov. 9, 2007; 3 pages.

USPTO Final Rejection for U.S. Appl. No. 10/313,283 dated Jul. 31, 2007; 10 pages.

USPTO Non-Final Rejection for U.S. Appl. No. 10/313,283 dated Apr. 24, 2007; 8 pages.

USPTO Non-Final Rejection for U.S. Appl. No. 10/313,283 dated Dec. 5, 2006; 9 pages.

Application No. 10-2006-7006268 Non-Final Rejection dated Apr. 18, 2011; 13 pages.

USPTO Notice of Allowance for U.S. Appl. No. 10/950,332 dated Jan. 2, 2008; 6 pages.

USPTO Advisory Action for U.S. Appl. No. 10/950,332 dated Nov. 19, 2007; 3 pages.

USPTO Final Rejection for U.S. Appl. No. 10/950,332 dated Aug. 1, 2007; 9 pages.

USPTO Non-Final Rejection for U.S. Appl. No. 10/950,332 dated May 25, 2007; 7 pages.

USPTO Non-Final Rejection for U.S. Appl. No. 10/950,332 dated Apr. 17, 2007; 8 pages.

USPTO Final Rejection for U.S. Appl. No. 10/950,332 dated Jan. 25, 2007; 9 pages.

USPTO Non-Final Rejection for U.S. Appl. No. 10/950,332 dated Oct. 4, 2006; 8 pages.

USPTO Non-Final Rejection for U.S. Appl. No. 10/950,332 dated Apr. 28, 2006; 8 pages.

USPTO Requirement for Restriction for U.S. Appl. No. 10/950,332 dated Mar. 7, 2006; 5 pages.

B.Y. Kim et al.; Technical Digest of the International Electron Devices Meeting; Washington DC, Dec. 7, 1997; pp. 463-466 (XP 10265542).

* cited by examiner

OXIDE-NITRIDE STACK GATE DIELECTRIC

CROSS REFERENCE TO RELATED APPLICATION

This application is a continuation application of U.S. application Ser. No. 10/950,332, filed 24 Sep. 2004, now U.S. Pat. No. 7,371,637 which claims the benefit of U.S. Provisional Application No. 60/506,713 filed 26 Sep. 2003.

BACKGROUND

Modern integrated circuits are constructed with up to several million active devices, such as transistors and capacitors, formed in and on a semiconductor substrate. Interconnections between the active devices are created by providing a plurality of conductive interconnection layers, such as polycrystalline silicon and metal, which are etched to form conductors for carrying signals. The conductive layers and interlayer dielectrics are deposited on the silicon substrate wafer in succession, with each layer being, for example, on the order of 1 micron in thickness.

A gate structure is an element of a transistor. FIG. 1 illustrates an example of a gate stack 8. A semiconductor substrate 10 supports a gate insulating layer 16, which overlaps doped regions (source/drain regions) in the substrate (12 and 14), and the gate insulating layer supports a gate 18, which is typically polycrystalline silicon. On the gate is a metallic layer 30. The metallic layer may be separated from the gate by one or more other layers, such as nitrides, oxides, or silicides, illustrated collectively as barrier layer 20. The metallic layer may in turn support one or more other layers (collectively 40), such as nitrides, oxides, or silicides. Oxide 22 may be formed on the sides of the gate to protect the gate oxide at the foot of the gate stack; and insulating spacers 24 may be formed on either side of the gate stack. Furthermore, contacts to the source/drain regions in the substrate, and to the gate structure, may be formed.

The continuous scaling of VLSI technologies has demanded a gate dielectric that is scaled down in thickness while maintaining the required leakage performance. Silicon dioxide met these requirements down to a thickness of about 25 Angstroms. Below this thickness it first becomes marginal for leakage; then the thickness control itself and finally the problem of boron penetration from the polysilicon on the gate oxide into the substrate becomes a very critical issue as the technologies moves to P+ poly gate for PMOSFETs for better performance. Nitrided $SiO_2$, in which nitrogen is incorporated (2 to 3%) by annealing the gate oxide in $N_2O$ or NO, has been proposed. This dielectric is robust for boron penetration, due to the fact that nitrided $SiO_2$ is better for leakage because of the slightly higher dielectric constant. This dielectric can be scaled down to about 22 to 24 Angstroms (physical thickness), below which it fails due to leakage and boron penetration. Since NO annealing also increases the oxide thickness, there is a limit to the amount of nitrogen that can be incorporated for a required thickness. For technology that uses a CD (critical dimension, which corresponds to the width of the gate) of 70 nm and smaller, the gate dielectric thickness should be in the range 14 to 16 Angstroms EOT (equivalent oxide thickness) which cannot be met by nitrided $SiO_2$. A new material is needed to meet all the requirements.

Current technology uses nitrided $SiO_2$ which is formed by first growing $SiO_2$ by dry or wet oxidation and the oxide is typically annealed in NO, at about 850° C. to 900° C. for at least 15 minutes, to incorporate sufficient nitrogen. It is very difficult to scale the thickness below about 18 Angstroms, since the oxidation is too fast and annealing in NO grows significant amounts of oxide. The dielectric is also physically too thin for an EOT of 15 to 16 Angstroms. At this thickness, there is too much tunneling current through the dielectric, resulting in high leakage. The thin dielectric also gives rise to unacceptable boron penetration. Incorporating more nitrogen calls for an increased anneal which would increase the oxide thickness beyond the required limit.

BRIEF SUMMARY

In a first aspect, the present invention is a method of making a semiconductor structure, comprising forming an oxide layer on a substrate; forming a silicon nitride layer on the oxide layer; annealing the layers in NO; and annealing the layers in ammonia. The equivalent oxide thickness of the oxide layer and the silicon nitride layer together is at most 25 Angstroms.

In a second aspect the present invention is a method of forming a gate dielectric, comprising forming an oxide layer on a substrate; forming a silicon nitride layer on the oxide layer; and annealing the layers in NO and ammonia. The oxide layer has a thickness of 6-10 Angstroms, and the silicon nitride layer has a thickness of 10-30 Angstroms.

In a third aspect, the present invention is a semiconductor structure, comprising a substrate, an oxide layer on the substrate, and a silicon nitride layer on the oxide layer. The oxide layer has a thickness of 6-10 Angstroms, and the silicon nitride layer has a thickness of 10-30 Angstroms.

In a fourth aspect, the present invention is semiconductor structure, comprising a substrate, an oxide layer on the substrate, and a silicon nitride layer on the oxide layer. The oxide layer together with the silicon nitride layer have an equivalent oxide thickness of 12-25 Angstroms.

DETAILED DESCRIPTION

The present invention makes use of the discovery that a bilayer gate dielectric, with the lower layer being silicon oxide, and the upper being silicon nitride, can be made which has an EOT of preferably 12-25 Angstroms, including 13-15 Angstroms, 14 Angstroms, and 20-25 Angstroms.

Figure 11:
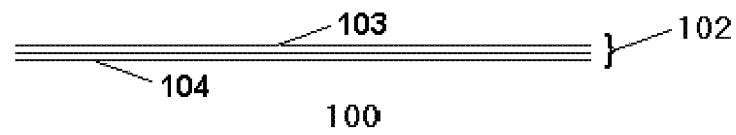
FIG. 11 shows the details of the gate stack dielectric.

The two-part gate dielectric is shown in FIG. 11. The gate insulating layer or dielectric layer 102, is composed of two parts: a silicon oxide layer 104, and a silicon nitride layer 103. The gate insulating layer 102 is on the substrate 100. The silicon oxide layer preferably has a thickness of 6-10 Angstroms, including 7, 8 and 9 Angstroms. The silicon nitride layer preferably has a thickness of 10-30 Angstroms, including 11, 12, 13, 14, 15, 16, 17, 18, 19, 20, 21, 22, 23 and 24 Angstroms.

The oxide layer may be formed in a variety of ways, after removing any native oxide from the substrate using hydrofluoric acid. One method is to use an RCA clean; another method is to rinse the substrate with deionized water containing ozone ($O_3$), to form an oxide layer having a thickness of about 8 Angstroms; this may be done as the rinse following the removal of the native oxide. In another method, low pressure (100-200 mTorr) oxygen, optionally diluted with nitrogen or another inert gas, is used to thermally grow the oxide layer. In still another method, the oxide layer may be formed by steam oxidation.

Once the oxide is formed, the silicon nitride layer may be formed. This may be done by forming nitrogen rich silicon nitride by LPCVD, using dichlorosilane and ammonia, preferably in a ratio of 1:1000 to 1:3, more preferably 1:100 to 1:33, most preferably 1:33. Alternatively, the silicon nitride layer may be formed from dichlorosilane and ammonia by Atomic Layer Deposition. Once formed, the layer may be annealed in NO at 800-900° C. for 15-30 minutes; and annealed in ammonia by rapid thermal annealing (RTA) for 30 seconds to 1 minute, or in a furnace for 5-10 minutes. Optionally, nitrogen may be used to dilute the NO and ammonia in either annealing process.

The remainder of the semiconductor structure may be formed as follows.

Figure 1:
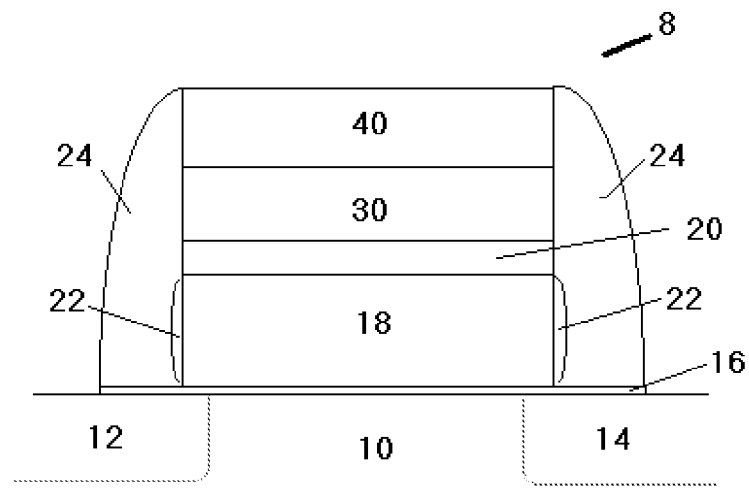
FIG. 1 shows a gate stack structure.
Figure 2:
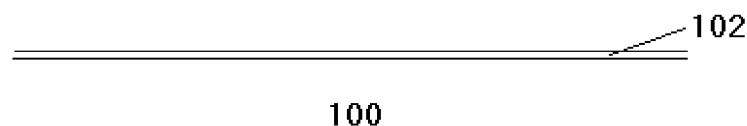
FIGS. 2-8 illustrate a method of forming the structure of FIG. 9.

Referring to FIG. 2, the gate insulating layer 102 is on the semiconductor substrate 100. The semiconductor substrate may be a conventionally known semiconductor material. Examples of semiconductor materials include silicon, gallium arsenide, germanium, gallium nitride, aluminum phosphide, and alloys such as $Si_{1-x}Ge_x$ and $Al_xGa_{1-x}As$, where $0 \leq x \leq 1$. Preferably, the semiconductor substrate is silicon, which may be doped or undoped.

Figure 3:
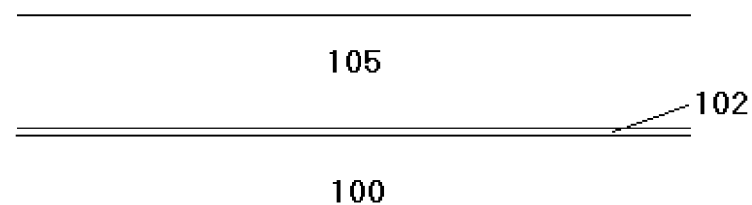

Referring to FIG. 3, a gate layer 105 may be formed on the gate insulating layer. The gate layer may contain a variety of semiconducting materials. Typically, a gate layer contains polycrystalline silicon (poly) or amorphous silicon. The gate layer may be doped with one type of dopant ($P^+$ or $N^+$), or it may contain both types of dopants in discrete regions. A split gate is a gate layer containing both $P^+$ and $N^+$ doping regions.

In the case of a split gate, those regions of the gate that are $P^+$ doped (such as with B or $BF_2^+$) are over $N^-$ doped channel regions of the substrate, forming a PMOS device; those regions of the gate that are $N^+$ doped (such as with $As^+$ or phosphorus$^+$) are over $P^-$ doped channel regions of the substrate, forming an NMOS device. The $P^+$ and $N^+$ doping regions of the gate are separated by a region which is on an isolation region of the substrate. The doping of the regions of the gate is preferably carried out after forming the gate, by masking and doping each region separately, or by an overall doping of the gate with one dopant type, and then masking and doping only one region with the other dopant type (counter doping).

Figure 4:
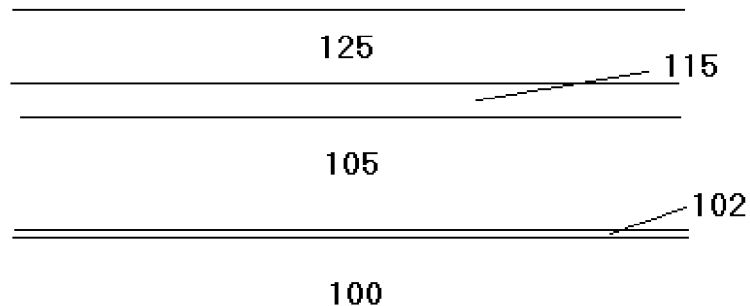

Referring to FIG. 4, a barrier layer 115 may optionally be formed on the gate layer. The optional barrier layer may contain a variety of materials, including nitrides, silicides, and oxides, and is preferably a conductive material. For example, the barrier layer may contain refractory silicides and nitrides. Preferably, the barrier layer contains tungsten nitride or silicide.

Referring still to FIG. 4, a metallic layer 125 may be formed on the gate layer, or the barrier layer 115, if it is present. Preferably, the metallic layer has a thickness of 200-600 angstroms, more preferably 300-500 angstroms, most preferably 325-450 angstroms. The metallic layer 125 may contain a variety of metal-containing materials. For example, a metallic layer may contain aluminum, copper, tantalum, titanium, tungsten, or alloys or compounds thereof. Preferably, the metallic layer comprises tungsten or titanium. The metallic layer may be formed, for example, by physical vapor deposition (PVD) of the metal, or by low pressure chemical vapor deposition (LPCVD) of a mixture of a metal halide and hydrogen.

Figure 5:
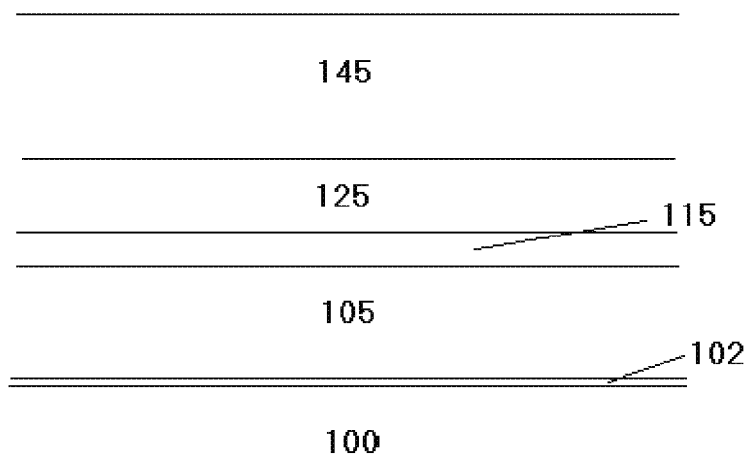

Referring to FIG. 5, an etch-stop layer 145 may be formed on the metallic layer by a variety of methods, including chemical vapor deposition (CVD). Preferably, the etch-stop layer is a nitride layer. More preferably, the etch-stop layer is silicon nitride formed by PECVD. The etch-stop layer may vary in composition, so that the top of the etch-stop layer is anti-reflective, for example so that the top of the etch-stop layer is silicon rich silicon nitride, or silicon oxynitride; this layer may also act as a hard mask to protect the etch-stop layer during subsequent etches. Alternatively, a separate anti-reflective layer (ARC) may be formed.

Preferably, the etch-stop layer is formed rapidly at a relatively low temperature. For example, if the gate layer contains both $P^+$ and $N^+$ doping regions, diffusion of the dopants may occur if the wafer is maintained at sufficiently high temperatures for a prolonged period of time. Thus, it is desirable that any high temperature processing is performed only for relatively short periods of time. Likewise, it is desirable that any lengthy processing is carried out at relatively low temperatures. Preferably, the etch-stop layer is formed at a temperature of at most 750° C., if the atmosphere is substantially devoid of oxygen, or in a reducing environment (hydrogen rich). Under typical conditions, a temperature of at most 600° C. is preferred, at most 450° C. is more preferred. A temperature of at least 350° C. is preferred, such as 400° C. The depositing of the etch-stop layer is preferably carried out at a temperature and for a time that does not result in substantial diffusion between the $P^+$ region and the $N^+$ region in a split gate.

Figure 6:
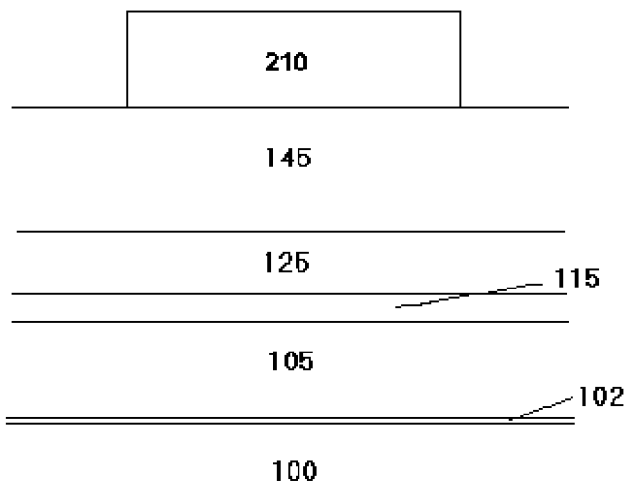
Figure 7:
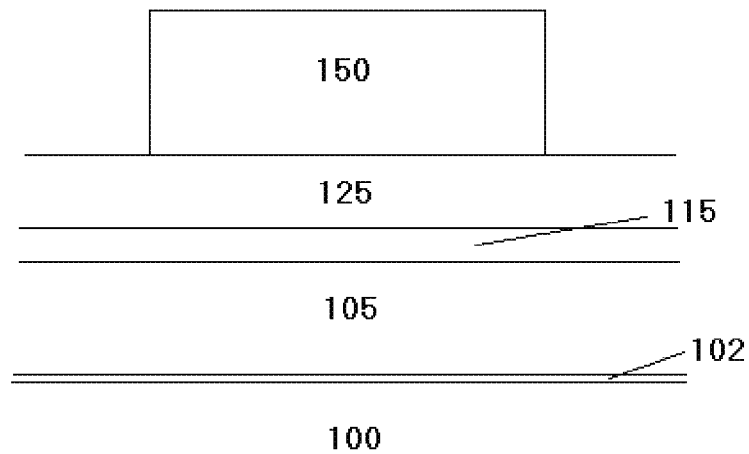

Referring to FIGS. 6-9, each layer may be patterned to form the gate stack. The patterning may be accomplished, for example, by conventional photolithographic and etching techniques. Referring to FIGS. 6 and 7, the etch-stop layer may be etched to form a patterned etch-stop layer 150, for example by forming a patterned photoresist 210 on etch-stop layer 145 (FIG. 6) and then etching the exposed portions of the layer. A hydrofluoric acid dip may be used to remove sidewall passivation.

The etch-stop etching may be carried out by exposure to a plasma formed from a mixture of gasses. Preferably, the gasses and plasma comprise carbon, fluorine and hydrogen. Preferably, the atomic ratio of fluorine:hydrogen is 43:1 to 13:3, more preferably 35:1 to 5:1, most preferably 27:1 to 7:1. Preferably, the mixture of gasses includes $CF_4$ and $CHF_3$; preferably the ratio by volume of $CF_4:CHF_3$ is 10:1 to 1:3, more preferably 8:1 to 1:2, most preferably 6:1 to 1:1. The gas mixture and plasma may also include other gasses, such as He, Ne or Ar. The pressure during etching is greater than 4 mTorr, preferably at least 10 mTorr, such as 10-80 mTorr, more preferably at least 15 mTorr, such as 15-45 mTorr, most preferably 25-35 mTorr.

Figure 8:
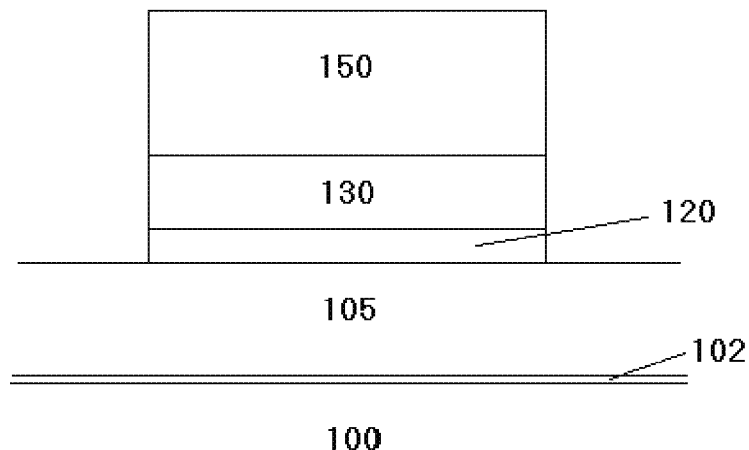
Figure 9:
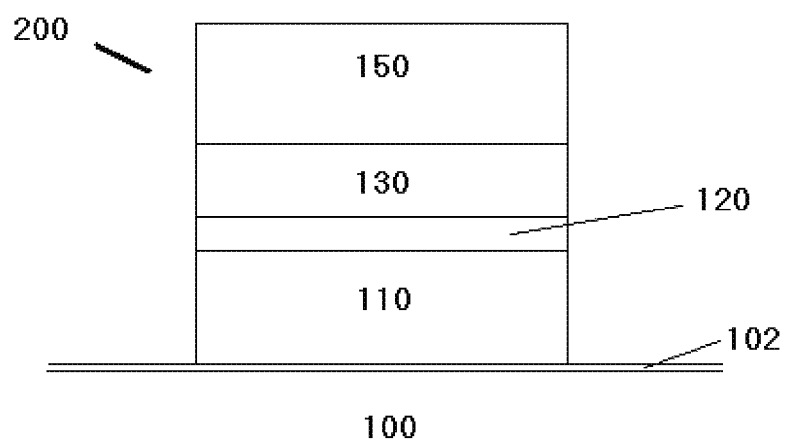
FIG. 9 shows a gate stack of the present invention.

The patterned etch-stop layer may be used as a hard mask for the etching of the metallic layer 125 (FIG. 7) to form a patterned metallic layer 130 (FIG. 8). The patterned etch-stop layer and the patterned metallic layer may be used as a hard mask for the etching of the gate layer 105 (FIG. 8) to form patterned gate layer 110 (FIG. 9). The gate etching may be carried out by conventional gate etch techniques, for example by exposure to a plasma formed from chlorine, hydrobromic acid and/or oxygen.

The patterned photoresist 210 (FIG. 6) may be removed at any stage of the gate stack formation following the etch-stop etch. For example, the patterned photoresist may be removed immediately after the etch-stop etch (as illustrated in FIGS. 6 and 7), or it may be removed after the etching of the metallic layer or after the gate etching. The removal of the photoresist may be followed by a cleaning procedure to ensure removal of any residual byproduct of the photoresist or of the photoresist removal. For example, the photoresist may be removed by ashing the patterned photoresist to provide a gate stack containing a patterned etch-stop layer (FIG. 7). This gate stack without a photoresist layer may then be treated with a cleaning solution to complete the removal and cleaning process. The most preferred cleaning agent contains water, 2-(2 aminoethoxy) ethanol, hydroxylamine, and catechol. An example of a cleaning solution is EKC265™ (EKC, Hayward, Calif.).

FIG. 9 thus illustrates a gate stack 200 which may be formed on a semiconductor wafer. Semiconductor substrate 100 supports a gate insulating layer 102, which in turn supports a gate layer 110. The gate layer supports a metallic layer 130, which may optionally be separated from the gate layer by barrier layer 120. The etch-stop layer 150 is on the metallic layer 130.

Figure 10:
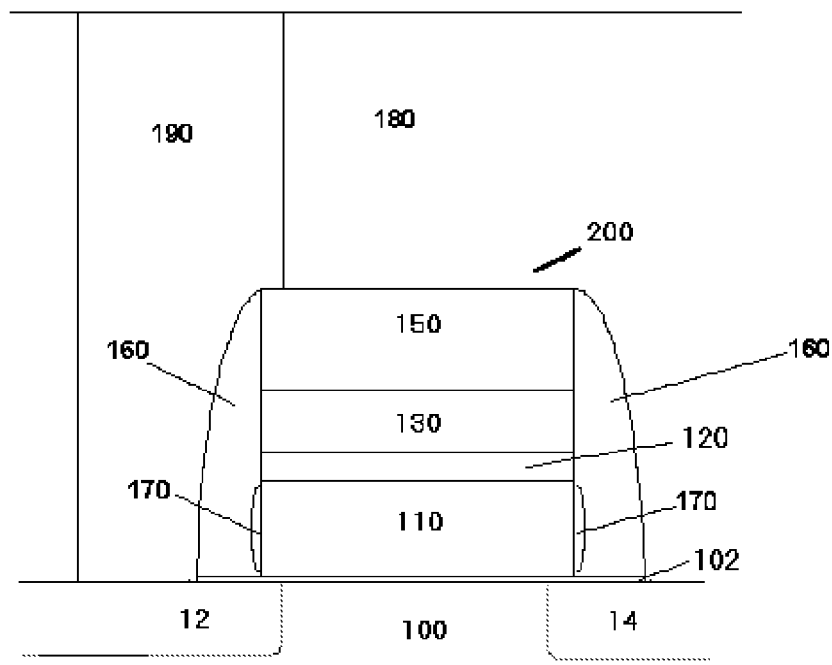
FIG. 10 show the gate stack of FIG. 9 after further processing.

Further processing of the gate structure may include forming sidewall oxide regions 170 on gate layer 110 and forming spacers 160 (preferably containing nitride) on the sides of the stack. Furthermore, a dielectric layer 180 maybe formed on the etch-stop layer, and contacts or via 190 formed through the dielectric to the substrate, as illustrated in FIG. 10. This via may be lined and filled to form a via-contact, for example with TiN and tungsten, respectively. Other processing may include forming contacts to the gate itself.

Other processing may be used to complete formation of semiconductor devices from the semiconductor structure. For example, source/drain regions 12, 14 may be formed in the substrate, additional dielectric layers may be formed on the substrate, and contacts and metallization layers may be formed on these structures. These additional elements may be formed before, during, or after formation of the gate stack.

The related processing steps, including the etching of the gate stack layers and other steps such as polishing, cleaning, and deposition steps, for use in the present invention are well known to those of ordinary skill in the art, and are also described in Encyclopedia of Chemical Technology, Kirk-Othmer, Volume 14, pp. 677-709 (1995); Semiconductor Device Fundamentals, Robert F. Pierret, Addison-Wesley, 1996; Wolf, Silicon Processing for the VLSI Era, Lattice Press, 1986, 1990, 1995 (vols 1-3, respectively), and Microchip Fabrication 4rd. edition, Peter Van Zant, McGraw-Hill, 2000.

The semiconductor structures of the present invention may be incorporated into a semiconductor device such as an integrated circuit, for example a memory cell such as an SRAM, a DRAM, an EPROM, an EEPROM etc.; a programmable logic device; a data communications device; a clock generation device; etc. Furthermore, any of these semiconductor devices may be incorporated in an electronic device, for example a computer, an airplane or an automobile.

Figure 12:
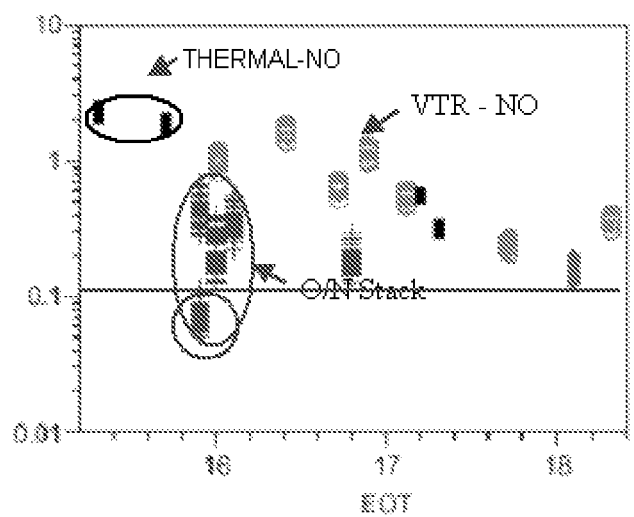
FIG. 12 is a graph showing leakage.

Using the two-part gate dielectric of the invention shows a Vt (threshold voltage) for a PMOS FET slightly higher than that of SiON (−0.54 vs. −0.46), indicating no boron penetration. FIG. 12 is a graph showing leakage on the vertical axis ($A/cm^2$), and EOT (in Angstroms) on the horizontal axis. In this graph, "THERMAL-NO" represent a device having a thermally grown oxide, followed by annealing in NO; "VTR-NO" is oxide grown thermally in a vertical furnace, followed by annealing in NO; and O/N stack is the two-part gate dielectric of the present invention.

What is claimed is:

1. A method of making a semiconductor structure, comprising:
    forming an oxide layer on a substrate;
    forming a silicon nitride layer on the oxide layer;
    annealing layers in NO; and
    annealing the layers in ammonia;
    wherein the equivalent oxide thickness of the oxide layer and the silicon nitride layer together is at most 25 Angstroms.

2. The method of claim 1, wherein the oxide layer has a thickness of 6-10 Angstroms.

3. The method of claim 1, wherein silicon nitride layer has a thickness of 10-30 Angstroms.

4. The method of claim 1, wherein the forming of the oxide layer comprises rinsing the substrate with deionized water containing ozone.

5. The method of claim 1, wherein the forming of the oxide layer comprises stream oxidation.

6. The method of claim 1, wherein the forming of the oxide layer comprises thermally growing the oxide layer with oxygen.

7. A method of making an electronic device, comprising:
    forming a semiconductor device by the method of claim 1, and
    forming an electronic device comprising the semiconductor device.

8. A method of forming a gate dielectric, comprising:
    forming an oxide layer on a substrate;
    forming a silicon nitride layer on the oxide layer;
    annealing the layers in NO and ammonia;
    annealing the layers in ammonia,
    wherein the oxide layer has a thickness of 6-10 Angstroms, and
    the silicon nitride layer has a thickness of 10-30 Angstroms.

* * * * *